(12) United States Patent
Xie et al.

(10) Patent No.: US 10,939,564 B2
(45) Date of Patent: Mar. 2, 2021

(54) CIRCUIT BOARD, DISPLAY DEVICE AND METHOD FOR MANUFACTURING THE SAME

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Enming Xie, Beijing (CN); Dongxu Han, Beijing (CN); Wenchao Bao, Beijing (CN); Chun Cao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/423,878

(22) Filed: May 28, 2019

(65) Prior Publication Data
US 2020/0137898 A1    Apr. 30, 2020

(30) Foreign Application Priority Data

Oct. 24, 2018    (CN) .......................... 201811244184.0

(51) Int. Cl.
*H05K 1/02* (2006.01)
*H05K 1/11* (2006.01)
(Continued)

(52) U.S. Cl.
CPC ............. *H05K 5/0017* (2013.01); *G06F 1/10* (2013.01); *H05K 1/0298* (2013.01); *G09G 2310/0264* (2013.01); *G09G 2310/08* (2013.01)

(58) Field of Classification Search
CPC ... H05K 1/02; H05K 1/11; H05K 1/18; H05K 1/181; G02F 1/13; G02F 1/1345;
(Continued)

(56) References Cited

U.S. PATENT DOCUMENTS 7,494,381 B1 *    2/2009 Wu ...................... H01R 12/714
                                                        439/630
2002/0008682 A1 *  1/2002 Park ........................ G09G 3/20
                                                         345/87
(Continued)

FOREIGN PATENT DOCUMENTS

CN    103152979 A    6/2013
CN    105513498 A    4/2016
(Continued)

OTHER PUBLICATIONS

First Office Action for Chinese Application No. 201811244184.0, dated Jul. 29, 2019, 7 Pages.

*Primary Examiner* — Xiaoliang Chen
(74) *Attorney, Agent, or Firm* — Brooks Kushman P.C.

(57) ABSTRACT

A circuit board includes a substrate, an input binding region and at least two output binding regions disposed on the substrate. Each of the output binding regions includes a plurality of binding portions, and the number of the binding portions included in different output binding regions is different. The substrate is configured to output a signal received by the input binding region to respective binding portions included in each of the output binding regions.

8 Claims, 1 Drawing Sheet

(51) Int. Cl.
*H05K 1/18* (2006.01)
*G02F 1/13* (2006.01)
*G02F 1/1345* (2006.01)
*H01L 23/00* (2006.01)
*H01L 23/52* (2006.01)
*H01L 23/498* (2006.01)
*G09G 5/10* (2006.01)
*H05K 5/00* (2006.01)
*G06F 1/10* (2006.01)

(58) Field of Classification Search
CPC ....... H01L 23/00; H01L 23/52; H01L 23/498; H01L 23/49816; H01L 23/49838; G09G 5/10
USPC .......... 361/760, 736, 767; 345/87, 174, 204, 345/211, 690; 349/73, 149; 257/773; 174/262; 1/1
See application file for complete search history.

(56) References Cited

U.S. PATENT DOCUMENTS

| | | | |
|---|---|---|---|
| 2002/0050406 A1* | 5/2002 | Yamashita | H01L 22/32 174/260 |
| 2003/0058398 A1* | 3/2003 | Yano | G02F 1/13458 349/149 |
| 2006/0221290 A1* | 10/2006 | So | G02F 1/13452 349/149 |
| 2009/0014206 A1* | 1/2009 | Motohashi | H05K 1/114 174/262 |
| 2009/0027595 A1* | 1/2009 | Takahashi | G09G 3/3677 349/73 |
| 2010/0006869 A1* | 1/2010 | Choi | H01L 23/4985 257/88 |
| 2012/0068349 A1* | 3/2012 | Kim | H01L 24/06 257/773 |
| 2013/0141912 A1 | 6/2013 | Kim | |
| 2014/0115199 A1* | 4/2014 | Yoshikawa | G06F 13/4068 710/51 |
| 2014/0240291 A1* | 8/2014 | Nam | G06F 3/044 345/174 |
| 2015/0226995 A1* | 8/2015 | Aota | H01L 23/49816 349/149 |
| 2015/0234758 A1* | 8/2015 | Yoshikawa | H01L 23/49838 710/308 |
| 2015/0311148 A1* | 10/2015 | Jung | H01L 23/49838 361/767 |
| 2016/0029478 A1* | 1/2016 | Bayerer | H05K 1/0256 361/736 |
| 2017/0013717 A1* | 1/2017 | Tsukao | H05K 1/0284 |
| 2017/0127512 A1* | 5/2017 | Park | H05K 1/111 |
| 2017/0164474 A1* | 6/2017 | Kim | H05K 1/111 |
| 2017/0207190 A1* | 7/2017 | Tsukao | H01L 24/17 |
| 2017/0332495 A1* | 11/2017 | Kim | H05K 1/115 |
| 2018/0108604 A1 | 4/2018 | Chen et al. | |
| 2019/0049770 A1 | 2/2019 | Guan et al. | |
| 2019/0163304 A1* | 5/2019 | Shim | H01L 51/0097 |
| 2019/0164998 A1* | 5/2019 | Cho | G09G 3/3266 |
| 2019/0244906 A1* | 8/2019 | Min | H01L 23/49811 |
| 2019/0319082 A1* | 10/2019 | Nam | H01L 27/1218 |

FOREIGN PATENT DOCUMENTS

| | | |
|---|---|---|
| CN | 105657967 A | 6/2016 |
| CN | 107741677 A | 2/2018 |
| CN | 108417151 A | 8/2018 |
| KR | 1020080077588 A | 8/2008 |

* cited by examiner

CIRCUIT BOARD, DISPLAY DEVICE AND METHOD FOR MANUFACTURING THE SAME

CROSS-REFERENCE TO RELATED APPLICATION

This application claims priority to Chinese Patent Application No. 201811244184.0 filed on Oct. 24, 2018, which is incorporated herein by reference in its entirety.

TECHNICAL FIELD

The present disclosure relates to the field of circuit board design, in particular to a circuit board, a display device and a method for manufacturing the same.

BACKGROUND

In a process of developing a display product, for display products with similar sizes but different resolutions, because the number of driving chips is different, it is often necessary to redesign a circuit board for providing timing control signals for the driving chips, which leads to more types and times of circuit board design and increases development time.

SUMMARY

A first aspect of the present disclosure provides a circuit board including a substrate, an input binding region and at least two output binding regions disposed on the substrate; wherein the input binding region and the at least two output binding regions are disposed on the substrate, each of the at least two output binding regions comprises a plurality of binding portions, and a number of binding portions included in different output binding regions is different, and the substrate is configured to output a signal received by the input binding region to respective binding portions included in each of the at least two output binding regions.

In some embodiments, the at least two output binding regions include a first output binding region and a second output binding region, the first output binding region includes an odd number of the binding portions, and the second output binding region includes an even number of the binding portions.

In some embodiments, a separation region is arranged between two adjacent output binding regions of the at least two output binding regions, and the substrate comprises a hollow structure located at the separation region.

In some embodiments, the at least two output binding regions are located on a same side of the substrate, and the input binding region is located at a side opposite to the side of the substrate where the at least two output binding regions are located.

In some embodiments, the plurality of binding portions included in each of the output binding regions is arranged in a first direction.

In some embodiments, a distance between two adjacent output binding regions of the at least two output binding regions in a direction perpendicular to the first direction is greater than or equal to 5 mm.

Based on a technical solution of the circuit board provided by the foregoing embodiment, the second aspect of the present disclosure provides a display device including a display panel, a plurality of driving modules, a timing control module, and the above circuit board, wherein the plurality of driving modules are bound to an edge of the display panel, and the plurality of driving modules is also bound to a target output binding region in which a number of binding portions is the same as a number of the driving modules in the circuit board, and the timing control module is bound to the input binding region of the circuit board.

Based on a technical solution of the circuit board provided by the above embodiment, a third aspect of the present disclosure provides a method for manufacturing a circuit board, and the method includes: forming an input binding region and at least two output binding regions on the substrate; wherein each of the at least two output binding regions includes a plurality of binding portions, and a number of binding portions included in different output binding regions is different; the substrate is configured to output a signal received by the input binding region to respective binding portions included in each of the at least two output binding regions.

Based on a technical solution of the circuit board provided by the foregoing embodiment, a fourth aspect of the present disclosure provides a method for manufacturing a display device, including: binding the timing control module to the input binding region of the circuit board; determining a number of drive modules to be bound to the circuit board based on a resolution of the display device; determining a target output binding region in which a number of binding portions in the circuit board is the same as the number of the driving modules; binding the driving modules to a plurality of binding portions in the target output binding region in a one-to-one manner; and binding the driving modules to an edge of the display panel.

In some embodiments, when a side of the target output binding region away from the input binding region includes a non-target output binding region, before binding the driving module to the target output binding region of the circuit board, the method further includes: removing the non-target output binding region from the circuit board.

BRIEF DESCRIPTION OF THE DRAWINGS

The drawings described herein are intended to provide a further understanding of the present disclosure and constitute a part of the present disclosure, and the embodiments of the present disclosure and the description thereof are for explaining the present disclosure and do not constitute an undue limitation of the present disclosure.

DETAILED DESCRIPTION

In order to further explain the circuit board and a method for manufacturing the same provided by the embodiment of the present disclosure, a detailed description will be made below with reference to the accompanying drawings.

Taking a liquid crystal display device as an example, a structure of conventional liquid crystal display device generally includes a display panel, a driving chip, and a timing control circuit board for providing timing control signals for the driving chip. The driving chip is bound to the display panel and the timing control circuit board respectively, and under a control of the timing control signals outputted by the timing control circuit board, the driving chip outputs a driving signal to the display panel to drive the display panel to realize a display function.

In order to meet the needs of different application scenarios, the types of resolutions of liquid crystal display devices are more and more, and the liquid crystal display devices with different resolutions require to bound different numbers of driving chips, therefore in the liquid crystal display devices with different resolutions, designs of the corresponding timing control circuit boards are different. Illustratively, when n driving chips need to be bound in the liquid crystal display device, the corresponding timing control circuit board needs to be able to provide timing control signals for n driving chips, and when n−1 driving chips need to be bound in the liquid crystal display device, the corresponding timing control circuit board needs to be able to provide timing control signals for n−1 driving chips; thus, when an actual display product is developed, for display products having different resolutions, different timing control boards need to be designed, leading to increase development time.

Based on the above problems, a plurality of binding regions can be disposed on the circuit board to meet the requirements of display products with different resolutions at the same time, thereby overcoming the above problems.

Figure 1:
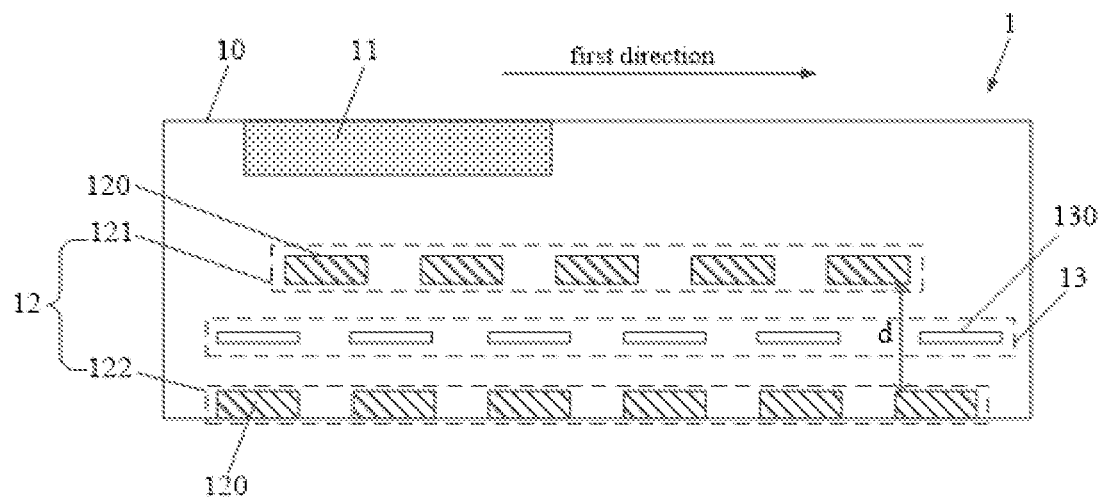
FIG. 1 is a schematic structural diagram of a circuit board according to an embodiment of the present disclosure.

Referring to FIG. 1, an embodiment of the present disclosure provides a circuit board 1 including a substrate 10, an input binding region 11 and at least two output binding regions 12 disposed on the substrate 10. Each of the output binding regions 12 includes a plurality of binding portions 120, and the number of binding portions 120 included in different output binding regions 12 is different. The substrate 10 is configured to: output signals received by the input binding region 11 to the respective binding portions 120 included in the output binding regions 12 respectively.

The application mode of the circuit board 1 is as follows. The input binding region 11 of the circuit board 1 is used to bind a timing control module. A resolution of the display product to which the circuit board 1 is applied is determined, thereby determining the number of the driving chips to be bound to the display product. According to the number of the driving chips, the target output binding region in which the number of the binding portions 120 in the circuit board 1 is the same as the number of the driving chips is determined, and then the driving chips are bound to a plurality of the binding portions 120 in the target output binding region in a one-to-one manner.

When the circuit board 1 is in operation, the timing control signal is input by the timing control module bound to the circuit board 1, and the timing control signal is transmitted through the circuit board 1 to the respective driving chips bound to the target output binding region.

It should be noted that in practical applications, a bare chip is generally packaged on a flexible substrate by using a Chip-On-Film technology (COF for short) to form a packaged driving chip. After the driving chip is bound to the display panel 2 and the circuit board 1, the circuit board 1 transmits the timing control signal to the driving chip via the binding portion 120 bound to the driving chip, and the driving chip transmits the driving signal to the display panel 2 via a bonding point of the bare chip and the flexible substrate and metal lines on the flexible substrate under the control of the timing control signal. In addition, it should be noted that when the timing control module is bound to the input binding region 11, the number and type of connectors set in the input binding region may be determined according to a type of the driving chip to be bound by the display product, and then the timing control module is electrically connected to a connector disposed in the input binding region. Further, the connector disposed in the input binding region can be simultaneously connected to all or part of the binding portions 120 included in each of the output binding regions 12, and provides signals to these connected binding portions 120.

According to a specific structure and an actual application manner of the circuit board 1 described above, the circuit board 1 provided by an embodiment of the present disclosure includes at least two output binding regions, and each of the output binding regions 12 includes a plurality of binding portions 120. The number of the binding portions 120 included in the different output binding regions 12 is different, thus, when the circuit board 1 is actually applied, the driving chip can be bound to the target output binding region in which the number of the binding portions 120 is the same as the number of driving chips in the circuit board 1 based on the number of driving chips to be bound. It is not necessary to individually design a corresponding board 1 based on the number of driver chips to be bound. Therefore, the circuit board provided by the embodiment of the present disclosure is capable of being compatible with a display product with different number of driving chips, reduces the number of the circuit board 1 and number of designs of the circuit board 1, which saves development time of the display product and reduces production cost.

In some embodiments, the at least two output binding regions 12 include a first output binding region 121 and a second output binding region 122. The first output binding region 121 includes an odd number of binding portions 120, and the second output binding region 122 includes an even number of binding portions 120.

Specifically, when the number of the driving chips to be bound is an odd number, the driving chip may be bound to the first output binding region 121, and when the number of the driving chips to be bound is an even number, the driving chip may be bound to the second output binding region 122 described above.

In the above embodiment, the circuit board 1 includes two output binding regions 12, and the two output binding regions 12 are respectively provided to include an odd number of binding portions 120 and an even number of binding portions 120, which satisfy binding requirements of an odd number of driving chips and binding requirements of an even number of driving chips, and also make the circuit board 1 be designed to have a small area, which is more advantageous for the display product to achieve a narrow border.

Further, in the at least two output binding regions 12, a separation region 13 is provided between adjacent output binding regions 12, and the substrate 10 includes a hollow structure 130 located in the separation region 13.

Specifically, in an actual application, only one output binding region 12 needs to be bound to the driving chip, and the other output binding region 12 are not applied. Therefore, in the case of not affecting a normal application of the circuit board 1, the unused output binding region 12 can be removed from the circuit board 1 so that the circuit board 1 has a smaller area, which is more advantageous for the display product to achieve a narrow border.

A separation region 13 is included between the adjacent output binding regions 12 and the substrate 10 includes a hollow structure 130 in the separation region 13 such that when the unused output binding region 12 is removed from the circuit board 1 (for example, by hand), it is more convenient and faster, and does not need to use an overly complicated process, thereby realizing that no additional complicated process is required and a requirement for a narrow border of the display product may be meet.

It should be noted that when the output binding region 12 that is not applied on the circuit board 1 is removed, it is considered whether the output binding region 12 applied to the circuit board 1 can normally work after the unused output binding region 12 is removed, if not working properly, the unused output binding region 12 will not be removed. Exemplarily, when the first output binding region 121 and the second output binding region 122 are included in the circuit board 1, and the second output binding region 122 is disposed at the edge of the circuit board 1, the first output binding region 121 is located between the second output binding region 122 and the input binding region 11, circuit lines connected between the input binding region 11 and the second output binding region 122 in the circuit board 1 passes through the first output binding region 121, then, when the driving chip is bound to the second output binding region 122, the unused first output binding region 121 cannot be removed, and when the driving chip is bound to the first output binding region 121, since the circuit lines connected between the input binding region 11 and the first output binding region 121 does not pass through the second output binding region 122, the second output binding region 122 may be removed.

Further, in the circuit board 1 provided in the above embodiment, the input binding region 11 and the output binding region 12 are disposed on the substrate 10 in various positions, and may be specifically set according to actual needs. Illustratively, the at least two output binding regions 12 are located on the same side of the substrate 10, and the input binding region 11 is located on another side opposite to the side of the substrate 10 where the at least two output binding regions 12 are located.

Specifically, when the circuit board 1 is set in the above-mentioned manner, the circuit board 1 can be formed into a strip shape, that is, the input binding region 11 and the output binding region 12 are respectively formed on the two long sides of the circuit board 1, so that the circuit board 1 is capable of achieving a normal function while having a narrower side. When the circuit board 1 is applied to a display product, it is more advantageous for the display product to achieve a narrow border.

Further, the plurality of binding portions 120 included in each output binding region 12 may be arranged in a first direction.

Specifically, the plurality of binding portions 120 included in each output binding region 12 are arranged in the first direction, so that each output binding region 12 can be elongated, thereby, when the output binding regions 12 are distributed on the substrate 10, the output binding regions 12 may be sequentially arranged in a direction perpendicular to the first direction, so that the circuit board 1 as a whole has a strip shape having a short width, and when the circuit board 1 is applied to the display product, it is more advantageous for the display product to achieve a narrow border.

Further, in the at least two output binding regions 12, a distance between adjacent two output binding regions 12 in a direction perpendicular to the first direction (d in FIG. 1) is greater than or equal to 5 mm.

Specifically, the distance between the two adjacent output binding regions 12 in the direction perpendicular to the first direction is greater than or equal to 5 mm, so that a certain security region is reserved between the adjacent two output binding regions 12, which not only makes the adjacent two output binding regions 12 not affect each other, but also does not affect the output binding region 12 remaining on the circuit board 1 when another output binding region 12 is removed.

Figure 2:
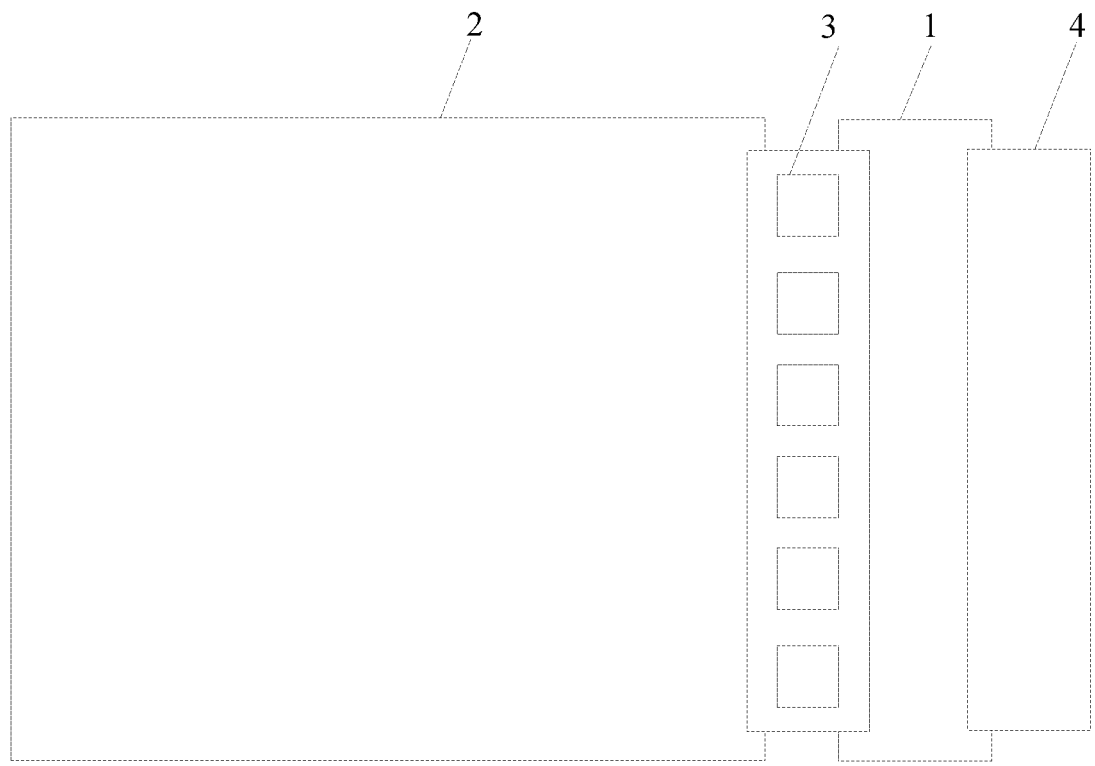
FIG. 2 is a schematic structural diagram of a display device according to an embodiment of the present disclosure.

As shown in FIG. 2, an embodiment of the present disclosure further provides a display device, including a display panel 2, a plurality of driving modules 3, a timing control module 4, and the circuit board 1 provided in the above embodiment. The plurality of driving modules 3 is bound to the edge of the display panel 2, and the plurality of driving modules 3 is also bound to a target output binding region in which the number of the binding portions 120 in the circuit board 1 is the same as the number of the driving modules 3, and the timing control module 4 is bound to the input binding region 11 in the circuit board 1.

Specifically, when the above display device is fabricated, the timing control module is bound to the input binding region 11 of the circuit board 1; a resolution of the display device is determined, thereby determining the number of the driving modules 3 (e.g., driving chips) that the display device needs to bind, and according to the number of the driving modules 3, the target output binding region in which the number of binding portions 120 in the circuit board 1 is the same as the number of the driving modules 3 is determined, and then the driving modules 3 are bound one-to-one to the plurality of binding portions 120 in the target output binding region; the driving module 3 is bound to an edge of the display panel 2 to complete production of the display device.

When the display device is in operation, a timing control signal is input by the timing control module bound to the circuit board 1. The timing control signal is transmitted to the respective driving modules 3 bound to the target output binding region via the circuit board 1, and the driving module 3 inputs a driving signal to the display panel 2 under a control of the timing control signal, so that the display panel 2 realizes a display function.

In the display device provided by the embodiment of the present disclosure, the circuit board 1 provided by the above embodiment is adopted, so that the number of the circuit boards 1 and design times of the circuit boards 1 are reduced during a manufacturing process of the display device, thereby effectively shortening a production time of the display device, improving production efficiency and saving production costs. In addition, the display device is more advantageous for implementing a narrow border of the display device after the circuit board 1 provided by the above embodiment is adopted.

An embodiment of the present disclosure further provides a method for manufacturing the circuit board 1, and the method includes fabricating an input binding region 11 and at least two output binding regions 12 on the substrate 10. Each output binding region 12 includes a plurality of binding portions 120, and the number of bindings portions 120 included in different output binding regions 12 is different. The substrate 10 is configured to output signal received by the input binding region 11 to the respective binding portions 120 included in the respective output binding regions 12.

Specifically, the application manner of the circuit board 1 is as follows. A timing control module is bound to the input binding region 11 of the circuit board 1. A resolution of the display product to which the circuit board 1 is applied is determined, thereby determining the number of the driving chips that the display product needs to be bound. The target output binding region in which the number of the binding portions 120 in the circuit board 1 is the same as the number of the driving chips is determined based on the number of the driving chips, and then the driving chips are bound to the plurality of binding portions 120 in the target output binding region in a one-to-one manner. When the circuit board 1 is in operation, the timing control signal is input by the timing control module bound to the circuit board 1, and the timing control signal is transmitted through the circuit board 1 to the respective driving chips bound to the target output binding region.

The circuit board 1 manufactured by the method provided by the embodiment of the present disclosure includes at least two output bonding regions, each of which includes a plurality of binding portions 120, and the number of the binding portions 120 included in different output binding regions 12 is different, therefore, when the circuit board 1 is actually applied, the driving chip can be bound to a target output binding region in which the number of the bonding portions 120 in the circuit board 1 is the same as the number of driving chips according to the number of driving chips to be bound, it is not necessary to individually design the corresponding circuit board 1 in order to adapt to the number of driving chips to be bound, thereby reducing the number of the circuit boards 1 and design times of the circuit board 1 and greatly saving development time for the display product.

Further, when the circuit board 1 is fabricated by the method provided in the above embodiment, the first output binding region 121 and the second output binding region 122 may be fabricated on the substrate 10. The first output binding region 121 includes an odd number of the binding portion 120 and the second output binding region 122 include an even number of the binding portions 120.

Further, when the circuit board 1 is fabricated by using the method provided by the above embodiments, the separation region 13 may be formed between two adjacent output binding regions 12 of the at least two output binding regions 12, and the substrate 10 includes a hollow structure 130 disposed in the separation region 13.

Further, when the circuit board 1 is fabricated by the method provided in the above embodiment, at least two output binding regions 12 can be located on a same side of the substrate 10, and the input binding region 11 is located on another side opposite to the side where at least two output binding regions 12 are located.

Further, when the circuit board 1 is manufactured by the method provided in the above embodiment, the plurality of binding portions 120 included in each of the output binding regions 12 can be arranged in the first direction.

Further, when the circuit board 1 is manufactured by the method provided by the above embodiment, a distance between adjacent two output binding regions 12 of the at least two output binding regions 12 in a direction perpendicular to the first direction can be greater than or equal to 5 mm.

An embodiment of the present disclosure further provides a method for manufacturing a display device, which is applied to the display device provided by the above embodiment, and the method includes: binding a timing control module 4 to an input binding region 11 of a circuit board 1; determining the number of drive modules 3 to be bound to the circuit board 1; determining a target output binding region in which the number of the binding portions 120 in the circuit board 1 is the same as the number of the driving modules 3; binding the drive modules 3 to the plurality of binding portions 120 in the target output binding region in a one-to-one manner.

Specifically, an application manner of the circuit board 1 is as follows. The timing control module 4 is bound to the input binding region 11 of the circuit board 1. A resolution of the display product to which the circuit board 1 is applied is determined, thereby determining the number of the driving modules 3 to be bound to the display product. The target output binding region in which the number of the binding portions 120 in the circuit board 1 is the same as the number of the driving modules 3 is determined according to the number of the driving module 3, and then the driving modules 3 are bound to the plurality of binding portions 120 in the target output binding region in a one-to-one manner. When the circuit board 1 is in operation, the timing control signal is input by the timing control module bound to the circuit board 1. The timing control signal is transmitted via the circuit board 1 to the respective driving modules 3 bound to the target output binding region.

In an embodiment of the present disclosure, according to the number of the driving modules 3 to be bound, the driving module 3 can be bound to the target output binding region 12 in which the number of the binding portions 120 in the circuit board 1 is the same as the number of the driving modules 3, it is not necessary to individually design the corresponding circuit board 1 in order to adapt the number of the driver modules 3 to be bound, thereby reducing the number of the circuit boards 1 and the times of designing the circuit board 1, which saves development time of the display product.

Further, when a side of the target output binding region 12 away from the input binding region 11 includes a non-target output binding region 12, before the driving module 3 is bound to the target output binding region of the circuit board 1, the method further includes removing the non-target output binding region from the circuit board 1.

Specifically, in the circuit board 1 provided by the above embodiment, in the at least two output binding regions 12, a separation region 13 is included between two adjacent output binding regions 12, and the substrate 10 includes a hollow structure 130 located at the separation region 13. When the circuit board 1 is in operation, the driving module 3 needs to be bound to only one output binding region 12 (i.e., the target output binding region), and the other output binding regions 12 are not used, therefore, in the case of not affecting normal application of the circuit board 1, the unused output binding region 12 can be removed from the circuit board 1 so that the circuit board 1 has a smaller area, which is more advantageous for the display product to achieve a narrow border.

In more detail, when the unused output binding region 12 is removed, it is considered whether the remaining output binding region 12 can be normally work after the unused output binding region 12 is removed, if no, the unused output binding region 12 will not be removed. Exemplarily, when the circuit board 1 includes the first output binding region 121 and the second output binding region 122, the second output binding region 122 is disposed at an edge of the circuit board 1, the first output binding region 121 is located between the second output binding region 122 and the input binding region 11, the circuit lines connected between the input binding region 11 and the second output binding region 122 in the circuit board 1 passes through the first output binding region 121. Then, when the driving chip is bound to the second output binding region 122, the unused first output binding region 121 cannot be removed. However, when the driving chip is bound to the first output binding region 121, since the circuit lines connected between the input binding region 11 and the first output binding region 121 do not pass through the second output binding region 122, the second output binding region 122 can be removed.

It should be noted that when the driving modules 3 is bound to the first output binding region 121, the first output binding region 121 is the target output binding region, and the second output binding region 122 is located at a side of the target output binding region away from the input binding region. The second output binding region 122 is a non-target output binding region, thus the second output binding region 122 can be removed.

The removing unused output bonding region 12 of the circuit board 1 from the circuit board 1 is more advantageous for the display product to achieve a narrow border.

Unless otherwise defined, technical terms or scientific terms used in the present disclosure are intended to be understood in the ordinary meaning of the ordinary skill of the art. The words "first," "second," and similar terms used in the present disclosure do not denote any order, quantity, or importance, but are used to distinguish different components. The word "comprise" or "include" or the like means that the element or item preceding the word include the elements or objects listed after the word and their equivalents, and do not exclude other elements or objects. The words "couple" or "connect" and the like are not limited to physical or mechanical connections, but may include electrical connections, whether direct or indirect. "upper", "lower", "left", "right", etc. are only used to indicate the relative positional relationship, and when an absolute position of the object to be described is changed, a relative positional relationship may also change accordingly.

It will be understood that when an element such as a layer, a film, a region or a substrate is referred to as being "on" or "below", or there may be intermediate elements.

In the description of the above embodiments, specific features, structures, materials or characteristics may be combined in any suitable manner in any one or more embodiments or examples.

The above is only the specific embodiment of the present disclosure, but the scope of the present disclosure is not limited thereto, and any person skilled in the art can easily think of changes or substitutions within the technical scope of the disclosure. It should be covered within the scope of protection of the present disclosure. Therefore, the scope of protection of the present disclosure should be determined by the scope of the claims.

What is claimed is:

1. A display device, comprising: a display panel, a plurality of driving modules, a timing control module, and a circuit board,
    wherein the circuit board comprises: a substrate; an input binding region; and at least two output binding regions, wherein the input binding region and the at least two output binding regions are disposed on the substrate, each of the at least two output binding regions comprises a plurality of binding portions, and a number of binding portions included in different output binding regions is different, and the substrate is configured to output a signal received by the input binding region to respective binding portions included in each of the at least two output binding regions;
    wherein the plurality of driving modules are bound to an edge of the display panel, and the plurality of driving modules is also bound to a target output binding region in which a number of binding portions is the same as a number of the driving modules in the circuit board, and the timing control module is bound to the input binding region of the circuit board.

2. The display device according to claim 1, wherein the at least two output binding regions comprise a first output binding region and a second output binding region, the first output binding region comprises an odd number of the binding portions, the second output binding region comprises an even number of binding portions.

3. The display device according to claim 1, wherein a separation region is arranged between two adjacent output binding regions of the at least two output binding regions, and the substrate comprises a hollow structure located at the separation region.

4. The display device according to claim 1, wherein the at least two output binding regions are located on a same side of the substrate, and the input binding region is located at a side opposite to the side of the substrate where the at least two output binding regions are located.

5. The display device according to claim 1, wherein the plurality of binding portions included in each of the output binding regions are arranged in a first direction.

6. The display device according to claim 5, wherein a distance between two adjacent output binding regions of the at least two output binding regions in a direction perpendicular to the first direction is greater than or equal to 5 mm.

7. A method for manufacturing a display device,
    wherein the display device includes: a display panel, a plurality of driving modules, a timing control module, and a circuit board,
    wherein the circuit board includes: a substrate; an input binding region; and at least two output binding regions, wherein the input binding region and the at least two output binding regions are disposed on the substrate, each of the at least two output binding regions includes a plurality of binding portions, and a number of binding portions included in different output binding regions is different, and the substrate is configured to output a signal received by the input binding region to respective binding portions included in each of the at least two output binding regions;
    wherein the plurality of driving modules are bound to an edge of the display panel, and the plurality of driving modules is also bound to a target output binding region in which a number of binding portions is the same as a number of the driving modules in the circuit board, and the timing control module is bound to the input binding region of the circuit board;
    the method for manufacturing the display device comprises:
    binding the timing control module to the input binding region of the circuit board;
    determining a number of drive modules to be bound to the circuit board based on a resolution of the display device;
    determining a target output binding region in which a number of binding portions in the circuit board is the same as the number of the driving modules;
    binding the driving modules to a plurality of binding portions in the target output binding region in a one-to-one manner; and
    binding the driving modules to an edge of the display panel.

8. The method according to claim 7, wherein when a side of the target output binding region away from the input binding region comprises a non-target output binding region, before binding the driving modules to the target output binding region of the circuit board, the method further comprising:

removing the non-target output binding region from the circuit board.

* * * * *